(12) United States Patent
Henig et al.

(10) Patent No.: US 9,513,174 B2
(45) Date of Patent: Dec. 6, 2016

(54) LOADS MANAGEMENT AND OUTAGES DETECTION FOR SMART GRID

(75) Inventors: Moshe Henig, Jerusalem (IL); Dov Yeger, Tal Shahar (IL)

(73) Assignee: GOLDWINGS S.G LTD., Tal Shahar (IL)

( * ) Notice: Subject to any disclaimer, the term of this patent is extended or adjusted under 35 U.S.C. 154(b) by 1048 days.

(21) Appl. No.: 13/500,132

(22) PCT Filed: Oct. 10, 2010

(86) PCT No.: PCT/IL2010/000819
§ 371 (c)(1),
(2), (4) Date: Apr. 4, 2012

(87) PCT Pub. No.: WO2011/042906
PCT Pub. Date: Apr. 14, 2011

(65) Prior Publication Data
US 2012/0197558 A1  Aug. 2, 2012

(30) Foreign Application Priority Data
Oct. 11, 2009 (IL) .......................... 201360

(51) Int. Cl.
*G01R 15/14* (2006.01)
*G01K 11/26* (2006.01)
*G01R 19/00* (2006.01)

(52) U.S. Cl.
CPC .......... *G01K 11/265* (2013.01); *G01R 15/146* (2013.01); *G01R 19/0092* (2013.01); *H04B 2203/5458* (2013.01)

(58) Field of Classification Search
CPC . G01K 11/265; G01R 15/146; G01R 19/0092; G01R 31/08; G01R 31/081; G01R 31/083; G01R 31/085; G01R 15/148; G01R 15/20; G01R 15/202; G01R 19/02
See application file for complete search history.

(56) References Cited

U.S. PATENT DOCUMENTS

| 4,584,523 A | 4/1986 | Elabd |
| 6,555,999 B1 * | 4/2003 | Lindsey ................. G01R 15/14 |
| | | 324/117 R |

(Continued)

FOREIGN PATENT DOCUMENTS

JP    2000241463 A    9/2000

OTHER PUBLICATIONS

International Search Report of PCT/IL2010/000819 Dated Feb. 11, 2011.

(Continued)

*Primary Examiner* — Mischita Henson
(74) *Attorney, Agent, or Firm* — Venable, LLP (57) ABSTRACT

A system for managing loads and detecting outages over electric power lines that comprises wireless temperature sensors which are attached to bare conductors of the electric power line(s), at line junctions or lines' splitting points, for sensing temperatures generated by the currents flow in the conductors. The system also includes a Current Measurement Units (CMU) for wirelessly reading the temperature sensed by the sensors, to allow cheap, rapid and easy RMS currents measurements on power lines at any voltage levels, by using temperature into current conversion formulas and tables.

16 Claims, 7 Drawing Sheets

(56) References Cited

U.S. PATENT DOCUMENTS

| | | |
|---|---|---|
| 7,336,202 B2 | 2/2008 | Kawai et al. |
| 8,065,099 B2 | 11/2011 | Gibala et al. |
| 2004/0071185 A1 | 4/2004 | Syracuse et al. |
| 2004/0130459 A1 | 7/2004 | Ramirez |
| 2004/0178925 A1 | 9/2004 | Kawai et al. |
| 2005/0286190 A1* | 12/2005 | Rostron ............... G01R 15/142 361/65 |
| 2007/0059986 A1 | 3/2007 | Rockwell |

OTHER PUBLICATIONS

International Preliminary Report on Patentability of PCT/IL2010/000819 Dated Jan. 5, 2012.
Lishvitz et al. "On-Line Temperature Monitoring of Power Distribution Equipment." IEEE Paper No. PCIC-2005-25. Sep. 25, 2012, pp. 223-231.
Supplementary European Search Report issued in EP10821676, dated: Sep. 27, 2013.

* cited by examiner

LOADS MANAGEMENT AND OUTAGES DETECTION FOR SMART GRID

FIELD OF THE INVENTION

The present invention relates to the field of Smart Grid loads and outages monitoring and management. More particularly, the invention relates to a method and system for creating cheap real time currents measurements, on power lines conductors.

BACKGROUND OF THE INVENTION

A smart grid delivers electricity from suppliers to customers using digital technology to save energy. This technology should also help to decrease peak demands of power, increase reliability and help to control voltage levels according to loads variations.

Smart grid (also called: Smart Electric Grid, Smart Power Grid, Intelligent Grid, IntelliGrid, FutureGrid, Intergrid, Intragrid etc.), need more information to enable to operate the control means like additional windings of transformers used to change voltage levels, circuit breakers used to connect/disconnect loads or make by-pass connections to increase power supply from under loaded lines to over-loaded lines in the network and vise-versa when load decreases.

Generators in electric utilities, generate current at medium voltage to transmission transformers. They raise the voltage to very high levels. All over the length of the transmission long lines, power substations, with their distribution transformers, transform the voltage back into medium voltages supplied to the industrial areas and residential quarters in the cities.

Control teams and control equipment in utilities and substations, has good information and measured data about voltages and currents of both sides of the distribution transformers (incoming and out going lines. Each line includes usually 3 phases). But there is always a lack of information at the splitting points of transmission lines where there is more than one substation connected on the line. There is also a lack of information about the currents at the splitting points off the outgoing lines of the distribution transformers, feeding large number of secondary lines in urban areas.

The problem is even bigger at urban areas where low voltage lines supply electric power to small businesses and residents and many customers are connected to branches of the same power line, and they depends each other in their power consumption influencing their mutual voltage levels. The control systems cannot detect such local variations in current and voltage levels usually compensated by other branches of the line. They can see only the total current and voltage levels outgoing from the substations. In case that there is a big increase in current of a branch of a line, due to overloading with its voltage drop associated (and probably a temperature limits excess problem), when in the same time there is a small power consumption in neighborhood line branches, the control team can not detect any problem.

Another problem of the electric grid control is to detect rapidly an outage and its location. It is hard to know, especially in bad weather conditions in winter and/or at night that one or more lines are ruptured (fallen trees on electric lines, electric towers prostrated by inundation etc.).

The lack of information about the current distribution in local networks results in lack of control means. It happens very often that in such places power consumption is very high during some working hours of businesses, during the day, and very low at night. As a result there is a big drop in voltage during the working hours and too high voltage levels at night. Usually customers complains enable to detect such areas, but there is no means to control such phenomenon but a costly change in the network configuration, because the power control center usually has no on line information about these load changes to enable smart power back-up switching.

Actual smart grid developments enable to improve the current and voltage curves, to decrease instant peaks, improve cosine cp and eliminate some kinds of perturbations on power supply lines. These Smart Grid systems also regulate the network by decrease of power consumption at peak hours (with the aide of lower tariffs at other hours of the day, which is usually called dynamic pricing). Utilities encourage customers to install and use programmable thermostats with automated settings by offering dynamic pricing to shave peak loads. This rebate helps to change customer's behavior to approve demand response. Actual existing Smart Grid load control measurement means have only the indications of the out going currents from substations and the customer's current consumption where digital smart power meters are installed. But there is no information on currents distribution in the network between the end users and the outputs of the substations to enable real and better load control and voltage level regulation.

To address these problems and to provide more efficient load management and outage detection improved smart grids are required.

It is an object of the present invention to provide a system which is capable of providing information about the currents at the splitting points off the outgoing lines, especially of the distribution transformers, feeding large number of secondary lines in urban areas.

It is another object of the present invention to provide a system for rapidly detecting an outage and its location.

Other objects and advantages of the invention will become apparent as the description proceeds.

SUMMARY OF THE INVENTION

The present invention relates to a system for managing loads and detecting outages over electric power lines, which comprises: a) at least one wireless temperature sensor attached to bare conductors of said electric power line(s), at line junctions or lines' splitting points, for sensing temperatures generated by the currents flow in said conductors; and b) a Current Measurement Units (CMU) for wirelessly reading the temperature sensed by said sensor(s), thereby enabling cheap, rapid and easy RMS currents measurements on power lines at any voltage levels, by using temperature into current conversion formulas and tables. The wireless temperature sensor is a passive Temperature SAW RFID Tag, a SAW resonator, or any other type of wireless temperature sensor.

According to an embodiment of the invention, the system further comprises a reference temperature sensor for providing an ambient temperature indication to the CMU.

According to an embodiment of the invention, the CMU comprises the following modules: a) a reader and its corresponding antenna for endlessly scanning the temperatures sensor(s), thereby reading the temperatures generated by the line cables currents; b) analog-digital and digital-analog converters; c) a controller for converting the temperature readings into currents according to conversion tables adjusted experimentally in laboratory for the type, cross section and material of the conductors and the ambient temperature; and d) a power supply module.

The Power Supply may further comprises a Backup Unit for providing alternative DC Low Voltage for the CMU and its modules. For example, the backup unit may include a Lithium Battery type or equivalent, having backing, capability duration according to customers' requirements and regional climate conditions (e.g. 72 hours). Wherein, the Power Supply is powered by an Inductive Charger, a Photo Voltaic (PV) Solar Panel, connected directly to Low Voltage Power Line or any combination thereof.

According to an embodiment of the invention, the reader is selected from the group consisting of: temperature readers, RFID reader, SAW RFID reader or combination thereof.

According to one embodiment of the invention, the CMU further comprises a wireless transceiver and its corresponding antenna for transferring data regarding the temperatures readings to a remote control center. Wherein, the transmission mode of the wireless transceiver is adapted to the network's configuration and customers' requirements. Optionally, the network's configuration includes optical fibers in shield wires of transmission lines (or in phases' cables).

According an embodiment of the invention, the CMU further comprises a Hall Effect Sensor/Switch for enabling detection and localization of lines' outages. The CMU has a decoding reader(s) and the Hall Effect Switches to transmit the currents' reading results and outage burst messages correspondingly via a controller module and a transceiver module. Wherein, each CMU's geographic coordinates are stored in the computers of the Control Center or in the controller of said CMU to enable providing the reparation teams with the relevant GPS data enabling the localization of lines' outages and access instructions to the downstream electric tower where currents are still flowing in the splitting line, and the next downstream electric tower which is out of power to enable working teams fast reparation.

Preferably, each CMU has its unique ID number (for example, ID number uvwxyz5 of CMU 93 in FIG. 9) associated to its n–1 line conductors (and one reference temperature conductor), referring to the number of the pole/tower on which said CMU is mounted, having its geographic coordinates stored in the Control Center's computers enabling to identify the CMU's transmitted temperatures and currents data, provided by the said CMU, and to provide to the working/reparation teams the GPS access instructions to the downstream electric tower equipped with a CMU where currents are still flowing in one or more of the splitting lines, and the next downstream electric tower equipped with a CMU, which is out of power to enable working teams fast localization and reparation.

According to an embodiment of the present invention, the system further comprises a Data Collection Scanning transceiver or plurality of Data Collection Scanning transceivers connected to a SCADA, SPC, HMI programs completing a full Manufacturing Execution System (MES) on a high speed quad-core CPU to provide for the operators at the Loading Control Monitors, a real time loads management information and outages detection indications and localization. Wherein, the data collecting scanning transceivers are possibly placed in the substations to collect data from CMUs accumulated by cascade methods to save scanning time and been sent in batch, current upstream, to the substations and then in batches to a central or main Data Collection Scanning transceiver.

According to an embodiment of the present invention, the system further comprises an Interface Generator for enabling to work in harmony with the Other Customers' Programs and Systems.

According to an embodiment of the invention, the temperature sensor is attached to the bare cable by any thermal conduction method. Wherein, the temperature sensor is attached to the bare cable by being bonded in a niche under a special clip made of metallic material adapted to the material of the line conductor in order to prevent corrosion (usually aluminum and cuprum alloys), with a special tooth and slot to assure good press of the clip by pressure and good heat transmission by using a heat conducting epoxy or any other appropriate heat sink compound; and wherein the pressed and bonded clip is or may have a slot for the antenna of the temperature sensor, and/or may be covered by a UV protected and temperature insulating heat shrinking plastic, forming a bonded jacket with some overlapping on the bare conductor out of the clip area and one or more layers around the conductor, to assure good protection against fast change in weather conditions like rain or wind blows which could introduce errors in temperature readings.

According to one embodiment of the invention, the system further comprises one or more Integrated Thermal Cameras connected to the CMU for providing temporarily or as a final solution, the cables' temperatures (especially for transmission lines where one should wait until the maintenance or reparation works, to enable tags attachment at such high voltage levels or where cables elongation indications/alarms are also desired).

The present invention, further relates to a method for managing loads and detecting outages over electric power lines, comprising the step of: a) providing at least one wireless temperature sensor attached to bare conductors of said electric power line(s), at line junctions or lines' splitting points, for sensing temperature according to the current flow in said conductors; and b) wirelessly reading said sensed temperature by CMU while using temperature into current conversion formulas and tables. Wherein reading the generated temperature by the CMU comprising the steps of: a) endlessly scanning the temperature sensor(s) for reading the generated temperature by CMU's Reader; b) converting said read generated temperature from analog signal into digital data; and c) converting the temperature readings into currents according to conversion tables adjusted experimentally in laboratory for the type, cross section and material of the conductors and the ambient temperature.

According to an embodiment of the invention, the CMU further comprises transferring data regarding the temperature reading to a remote control center via a wireless transceiver and its corresponding geographic coordinates and detecting lines' outages by using a Hall Effect Sensor/Switch and generating burst outage messages. Wherein the burst outage messages are directed to an Outage Control Monitor at the Control Center, thereby enabling the operators to read the messages and get the GPS information about the location and access to the outage relevant tower(s) or pole(s) where said outage occur, and to get other relevant screen windows, to enable better operation decisions.

According to an embodiment of the invention, the geographic coordinates of each CMU reporting an outage are stored in the computers of the Control Center to enable the localization of lines' outages and GPS access instructions to the downstream electric tower where currents are still flowing in one or more of the splitting lines, and the next downstream electric tower which is out of power to enable working teams fast localization and reparation by using a GPS device.

The data transmitted by the CMU is collected in a computerized center having a MES program including a SCADA, SPC and HMI, for analyzing the data and making the relevant comparisons (according to the grid management requirements), of currents measured in real time, to currents measured in previous same hours of the day at previous working days or not working days or same kind power consumption days, and so on, to give to the controllers at the control center according to their requirements the relevant information about significant deviations from normal rating currents on their loading control monitors. Wherein the MES program comprising the steps of: a) enabling the system to communicate and coordinate with other customer's programs and systems, for data exchange using an Interface Generator; and b) enabling to change formats and data displayed on the Monitors' screens and for displaying also information from said other customer's programs and systems using a Display Generator.

According to an embodiment of the invention, the remote control center is able by summation of currents of each splitting point downstream, comparing to the currents of each phase at the previous splitting point upstream, to detect any leakage or pirate connection where such phenomenon exists.

The present invention is a Smart Grid system for loads and outages monitoring and management by using Supervisory Control and Data Acquisition (SCADA), SPC, MES, HMI and large number of current measuring and sensing units spread all over the electricity supply network. More particularly, the invention relates to a method and system for creating cheap real time currents measurements, on power lines conductors, by using a generic technology of wireless temperature sensors, such as passive SAW RFID TAGS, attached to the lines conductors of electricity networks at any voltage levels. In some cases imager devices, such as cameras could be introduced. Additionally this invention provides a cheap system and method to enable fast detection and localization of lines outages and temperature excess alarms.

According to one aspect of the present invention, there is provided a large number of cheap Current Measuring Units (CMUs), based on generic technology of SAW RFID tags, attached to the electric lines cables, possibly at each splitting point/junction of the power lines. Thermal cameras can provide a temporary/permanent solution for transmission power lines, enabling by matrix image processing to measure the lines cables' temperatures/currents including cables elongation which is often a very important indication for electric transmission corporations.

Fast scanning of the real time transmitted information from the CMUs, by a SCADA system, brings to the Manufacturing Execution System (MES), the information. The information is analyzed by the Statistical Process Control (SPC), and presented by using a Human Machine Interface (HMI), on the Control Monitors of the Electric Power Control Center. The fast scanning, supported by high performance quad-core computers, enable to scan each minute or less, the output information from the CMUs, transmitting the information from up to millions of SAW RFID tags. The temperature of each power line cable, above the ambient temperature, measured by its tag is transformed to RMS current and compared according to the Grid Management requirements to the average current at the same hour in the working day before and/or compared to the average current at the same hour in the last week and/or any other comparison required (taking in consideration weekends, Holidays etc). In case of deviation from normal power consumption tolerances, the system will provide indications to enable the control intervention, manually or automatically.

According to another aspect of the present invention, using digital hall-effect switches, at the Current Measuring Units, will provide outage indications, by transmitting burst alarm signals. These outage fast detection indications will be directed to a special Outages Control Monitors at the Power Control Center. According to the SAW RFID tags associated to the specific current measuring unit, the operator will be able to click on the message and see the GPS coordinates of the electric tower and the map associated to the relevant outage reporting by this current measuring unit (the most upper CMU in the downstream line which is out of service). This will enable to send a working team for reparation, if necessary.

The Current Measuring Units are low power consuming units and will be powered inductively or by solar panel with a backup unit. In urban areas and low voltage networks it is possible to connect the measurement units directly to the network similarly to the streets lighting system (with a backup, like lithium battery or equivalent).

According to another aspect of the present invention, a transmission unit comprising a wireless transmitter, will transmit the results of the transformation of all the temperatures measured by the SAW RFID tags of each phase and cable into currents, via communication relays or directly to the scanning system at the Power Control Center. The system will provide also alarms associated to temperature excess on power lines, including the geographic positioning and recommendations to operators at the control center according to the MES analysis.

The MES program is a tool for the operators. It is a full internet/intranet interactive network management system (including a full maintenance system), with a secured access by personal user name and password enabling access from anywhere. Each manager and operator can get access to the relevant information he need (the system possess a screens generator user friendly). Such access enables to create easily a regional Control Center. Interface generator enables to couple the system to other operating systems of the network, including the ERP system of the power supply organization.

DETAILED DESCRIPTION OF PREFERRED EMBODIMENTS

Figure 1A:
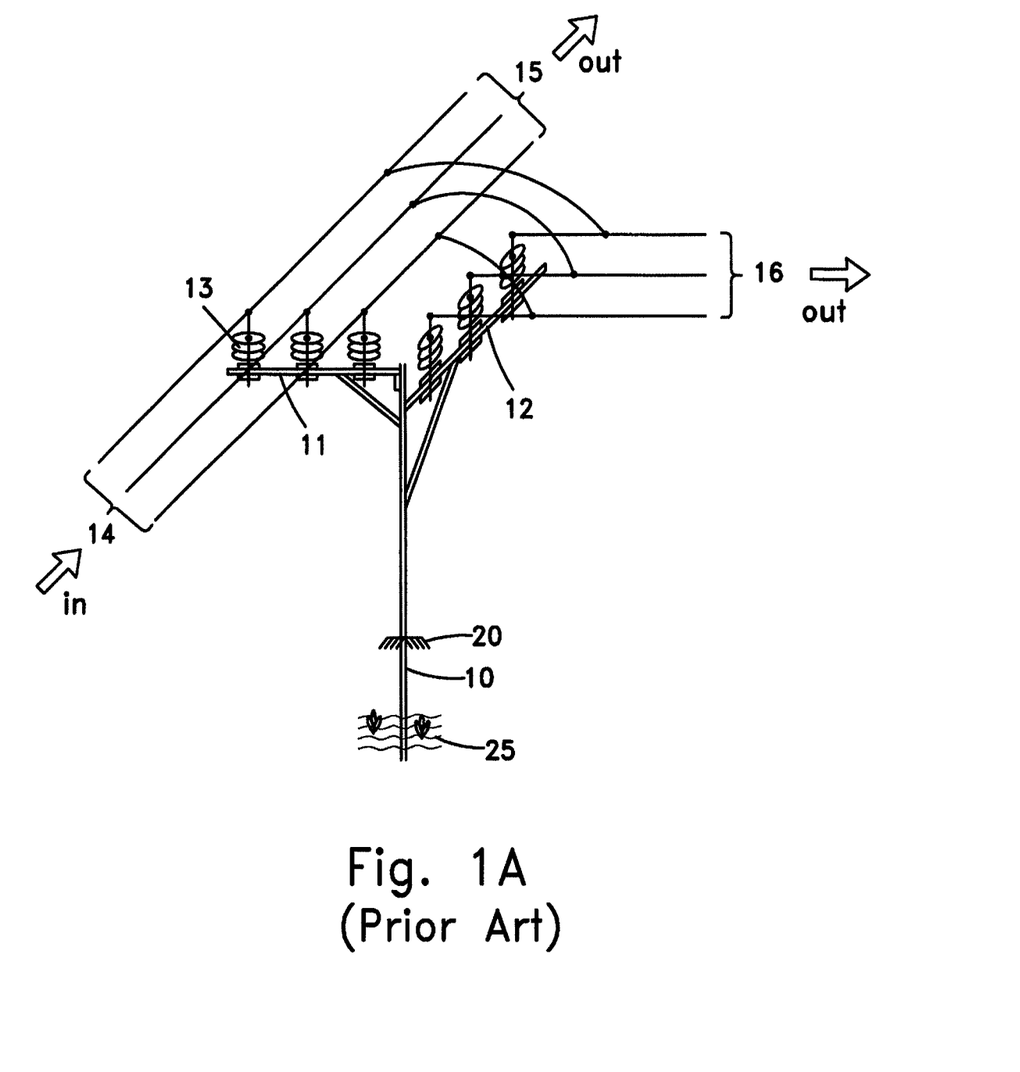
FIG. 1A schematically illustrates a typical pole with two splitting three phase lines, according to the prior art.

FIG. 1A schematically illustrates a typical concrete tubular electric lines pole 10 directly set in the earth 25, carrying two cross arms beams 11, 12, supporting with pin type insulators 13, an incoming three phase line conductors 14 (i.e., distribution line, supply transformer side) and two outgoing splitting lines 15, 16. Usually, such pole 10 may also comprises a safety lattice-type fence 20 for preventing the climbing of unauthorized persons on the pole. This embodiment shows an example of a concrete tubular pole with two splitting lines. Of course, the pole can be any type of tubular or other type of poles or electric lines towers carrying more than two cross arms beams or two outgoing splitting lines.

Figure 1B:
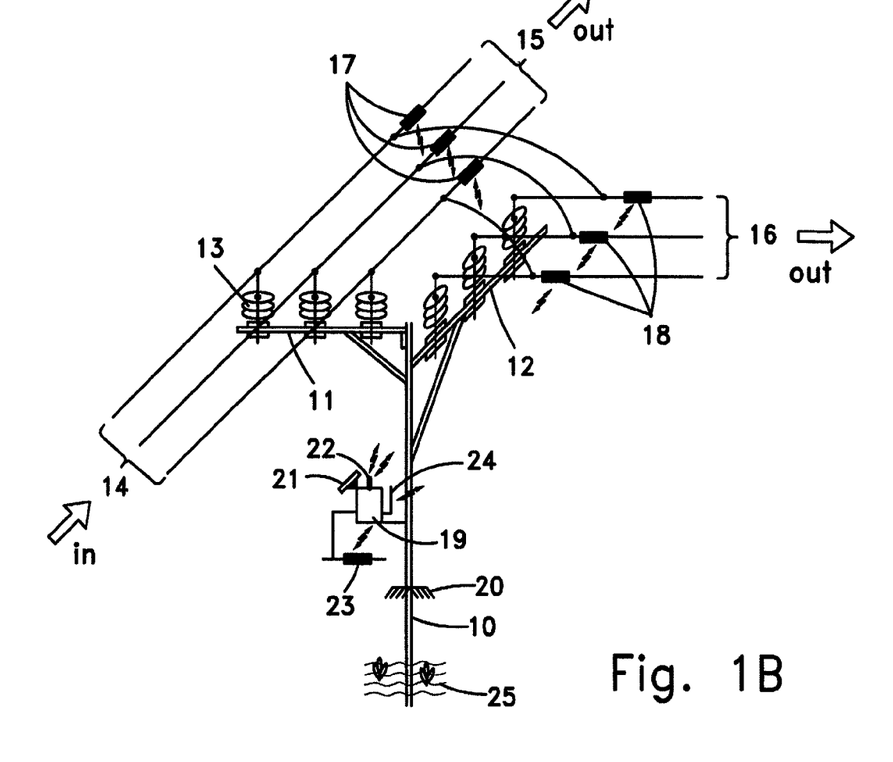
FIG. 1B schematically illustrates the typical pole provided with a smart grid system, according to an embodiment of the present invention.

FIG. 1B schematically the typical pole 10 equipped with a smart grid system according to an embodiment of the present invention. The smart grid system comprises a Current Measuring Unit (CMU) 19 and one or more passive temperature Surface Acoustic Wave Radio Frequency Identification (SAW RFID) Tag (such as SAW RFID Tags 17, 18), wherein the two outgoing splitting lines 15, 16 carry on each bare conductor the SAW RFID Tags 17, 18 respectively. The SAW RFID Tags 17, 18 serve as temperature sensors of the power lines cables.

Figure 5:
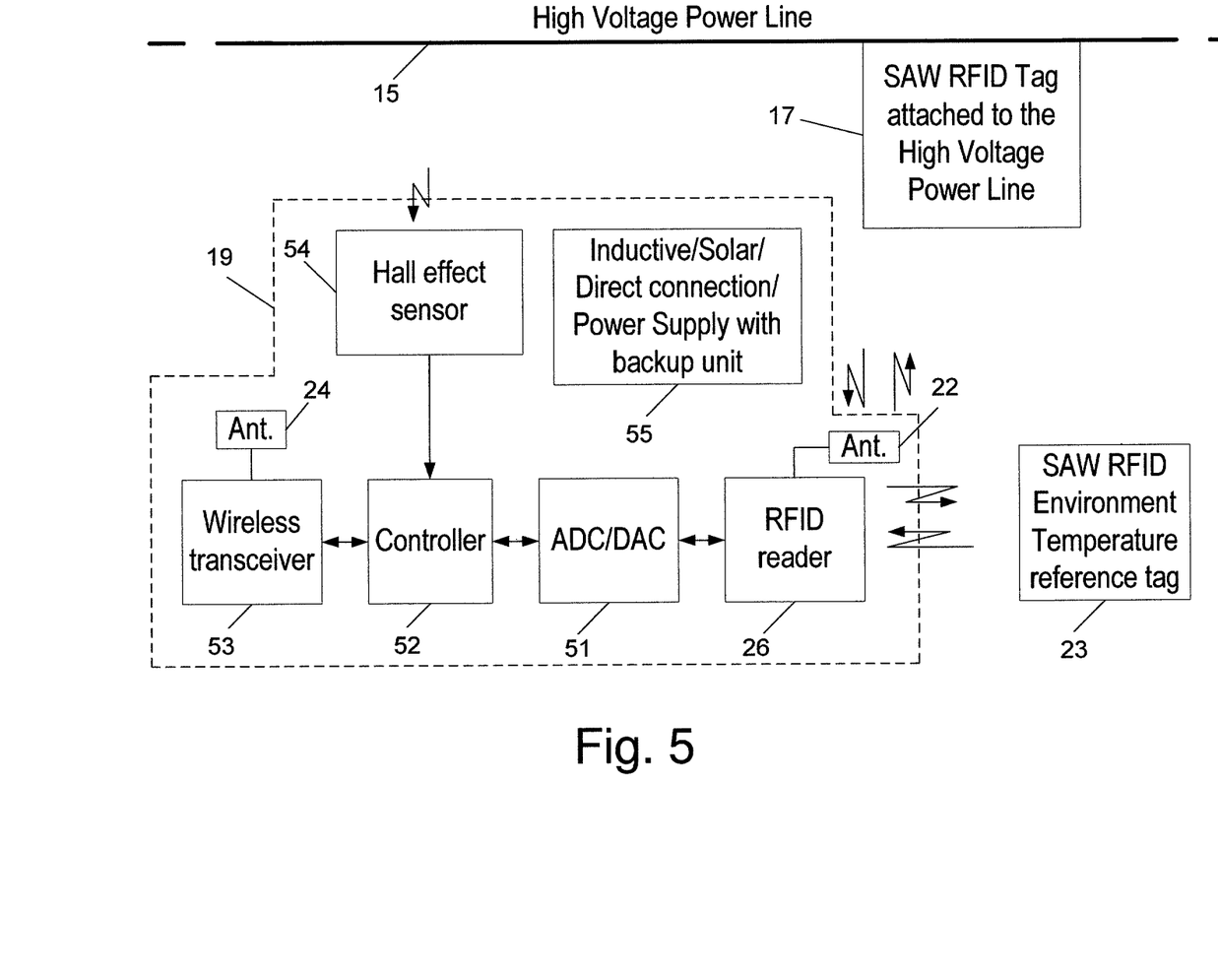
FIG. 5 is a bloc diagram of the Current Measuring Unit, including a SAW RFID TAG and a Reference Tag.

Referring now to FIG. 5, according to one embodiment of the invention, CMU 19 is a low power unit which comprises a Radio Frequency ID (RFID) transceiver 26 and its corresponding antenna 22, Analog-to-Digital Conversion and Digital-to-Analog Conversion (ADC/DAC) 51, a controller 52 such as Programmable Logic Controller (PLC), an internal wireless transceiver 53 and its corresponding antenna 24, Hall effect sensor 54 (optional), and a power supply unit 55. According to an embodiment of the present invention, the power supply 55 is a low power unit and such embodiment is described in further details with respect to FIG. 8.

In this embodiment, the CMU 19 is mounted below (e.g., 2-3 meters) the cross arms beams 11, 12 and above the safety lattice-type fence 20. CMU 19 can be powered by any suitable type(s) of power supply, such as inductive, solar, direct connection power supply with back up unit, etc. a PV solar panel 21 which provides energy to the low power CMU 19. CMU 19 communicates by the RF transceiver via its antenna 22 with the SAW RFID tags 17, 18 on the phase conductors. Optionally, the system comprises an additional SAW RFID tag 23 (which mounted on short segment of a cable of the same type and cross section as that of the phase conductors). SAW RFID tag 23 serves for an ambient temperature reference measurement.

According to one embodiment of the invention, the CMU 19 contains an outage detection unit. Additionally, the system may comprise one or more thermal camera (not shown), which, for example, can be mounted on the pole 10 under each splitting line(s) 15, 16. Alternatively, the thermal camera could be also used for the cables temperature sensing instead of the SAW RFID tags 17, 18 (especially in transmission power lines).

Figure 9:
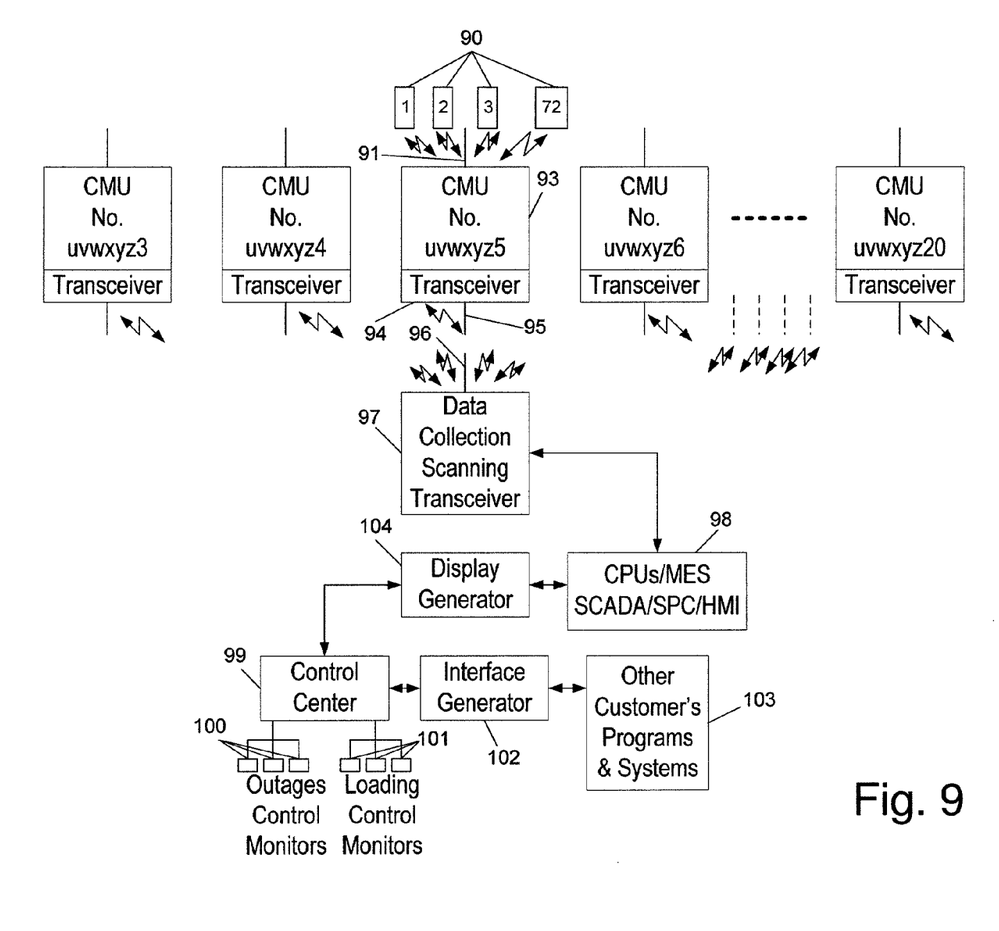
FIG. 9 is a bloc diagram of the whole system with the Currents Measuring Units (CMUs), a Data Transmission System, a Computerized Data Analyzing center with operators' Control Monitors.

The Tag's temperatures above ambient, are transformed into RMS currents levels, by the controller 52, feed with an appropriate calibrated transformation table for the specific line cables 15, 16 used at this specific pole 10. The internal wireless transceiver 53, via its antenna 24 transmits the data to a scanning transceiver 97 (FIG. 9) of a remote Control Center 99 (FIG. 9). The data transmission could be of any kind (e.g., this can be chosen by consulting the customer). Actually many shield wires on transmission lines may include optical fibers (OPGW), used for communication and control of power systems. Other options are by using a telemetry module with GSM/GPRS, RS485, RF, TCP, IP etc. Data transmission could use local communication relays realizing connection to main data transmission channels. For each ambient temperature there is a specific transformation table indicating the current for each measured temperature in the currents rating range, wherein the number of tables may varied according the intervals of ambient temperature required by the customer in his rating range (e.g., each 0.5° C. in the range of ambient temperatures between −10° C. up to +40° C.). Wherein each stored transformation table correspond to a specific ambient temperature and starts from that specific ambient temperature up to the maximum rating temperature indicating the current associated to each measured temperature (e.g., for ambient temperature of +25° C. we shall use the transformation table starting from +25° C. up to +150° C. indicating, for example, in case the measured temperature is +95° C. the RMS current is 121 Amp).

Figure 2:
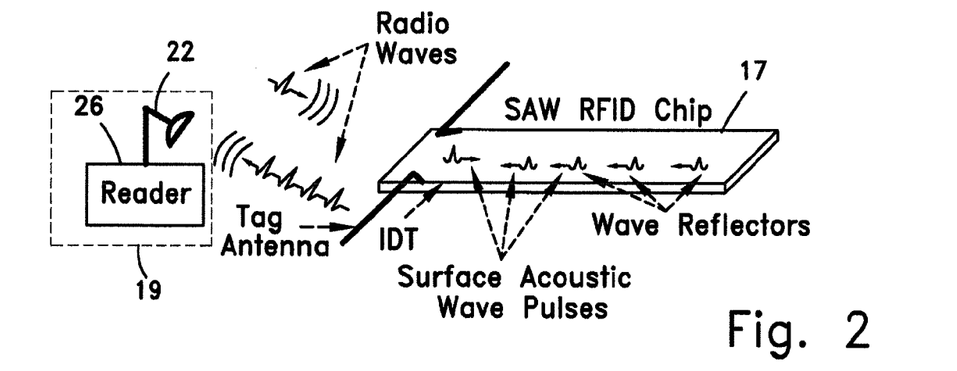
FIG. 2 is a schematic description of a SAW RFID TAG (chip), reflecting the RF waves transmitted by the Reader and modulated as Surface Acoustic Waves pulses by the special configuration of the Wave Reflectors influenced also by temperature expansion.

FIG. 2 is a schematic description of the SAW RFID Tag 17 (but is similar also to SAW RFID Tags 18 and 23 of FIG. 1), and its communication with RFID reader 26 of CMU 19 and its corresponding antenna 22 via radio waves (a detailed description of CMU 19 is shown with respect to FIG. 5). The Surface Acoustic Waves (SAW) phenomena and the SAW RFID Tag way of operation are described in further details herein after with respect to the system of the present invention.

Surface Acoustic Waves Phenomena and its Implementation in the Present Invention Surface Acoustic Waves (SAW) were first explained in 1885 by Lord Rayleigh, who described the surface acoustic mode of propagation and predicted its properties in his classic paper. Named after their discoverer, Rayleigh waves have a longitudinal and a vertical shear component that can couple with any media in contact with the surface. This coupling strongly affects the amplitude and velocity of the wave, allowing SAW sensors to directly sense mass and mechanical properties.

Virtually all acoustic wave devices and sensors use a piezoelectric material to generate the acoustic wave. Piezoelectricity was discovered by Brothers Pierre and Paul-Jacques Curie in 1880, received its name in 1881 from Wilhelm Hankel, and remained largely a curiosity until 1921, when Walter Cady discovered the quartz resonator for stabilizing electronic oscillators. Piezoelectricity refers to the production of electrical charges by the imposition of mechanical stress. The phenomenon is reciprocal. Applying an appropriate electrical field to a piezoelectric material creates a mechanical stress. Piezoelectric acoustic wave sensors apply an oscillating electric field to create a mechanical wave, which propagates through the substrate and is then converted back to an electric field for measurement.

Among the piezoelectric substrate materials that can be used for acoustic wave sensors and devices, the most common are quartz (SiO2), lithium tantalate (LiTaO3), and, to a lesser degree, lithium niobate (LiNbO3). Each has specific advantages and disadvantages, which include cost, temperature dependence, attenuation, and propagation velocity. An interesting property of quartz is that it is possible to select the temperature dependence of the material by the cut angle and the wave propagation direction. With proper selection, the first order temperature effect can be minimized. An acoustic wave temperature sensor may be designed by maximizing this effect.

The sensors are made by a photolithographic process. Manufacturing begins by carefully polishing and cleaning the piezoelectric substrate. Metal, usually aluminum, is then deposited uniformly onto the substrate. The device is spin-coated with a photoresist and baked to harden it. It is then exposed to UV light through a mask with opaque areas corresponding to the areas to be metalized on the final device. The exposed areas undergo a chemical change that allows them to be removed with a developing solution. Finally, the remaining photoresist is removed. The pattern of metal remaining on the device is called an interdigital transducer, or IDT. By changing the length, width, position, and thickness of the IDT, the performance of the sensor can be maximized.

Acoustic waves are distinguished primarily by their velocities and displacement directions; many combinations are possible, depending on the material and boundary conditions. The IDT of each sensor provides the electric field necessary to displace the substrate and thus form an acoustic wave. The wave propagates through the substrate, where it is converted back to an electric field at the IDT on the other side. FIG. 2 shows the configuration of a typical acoustic wave device which is used as a wireless temperature sensor of the system of the present invention. Transverse, or shear, waves have particle displacements that are normal to the direction of wave propagation and which can be polarized so that the particle displacements are either parallel to or normal to the sensing surface.

All acoustic wave devices are sensors in that they are sensitive to perturbations of many different physical parameters. Any change in the characteristics of the path over which the acoustic wave propagates will result in a change in the output.

According to an embodiment of the invention, a wireless temperature sensor can be created by selecting the correct orientation of propagation. The propagating medium changes with temperature, affecting the output. Surface wave velocities are temperature dependent and are determined by the orientation and type of crystalline material used to fabricate the sensor. Temperature sensors based on SAW delay line oscillators have millidegree resolution, good linearity, and low hysteresis. They are, however, very sensitive to mass loading and so must be sealed in a hermetic package. A 124 MHz ST-cut quartz, surface-skimming bulk wave temperature sensor was recently reported to have a temperature coefficient of 32 ppm/° C. and a resolution of 0.22° C. It also exhibited three orders of magnitude less sensitivity to mass loading than do SAW sensors. The response time was found to be 0.3 s, $10^3$ faster than BAW sensors. These temperature sensors have the additional advantage of requiring no power and of being wireless, making them well suited for use in remote locations.

Figure 3:
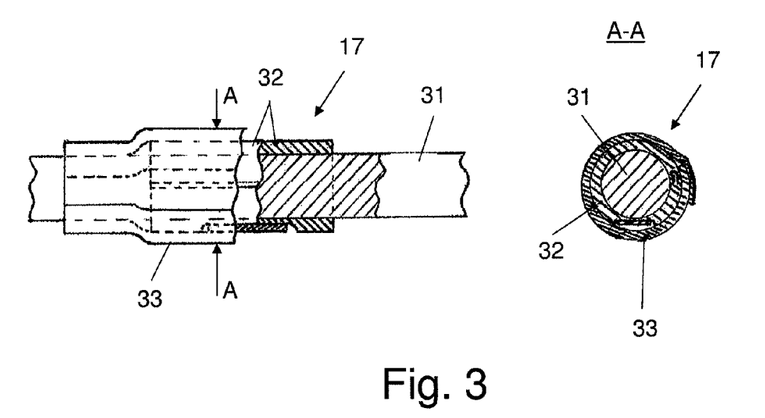
FIG. 3 shows the SAW RFID TAGS attachment configuration and its accessories.

FIG. 3 shows in a cross sectional view the SAW RFID Tag 17 (similar also to SAW RFID Tags 18 and 23 of FIG. 1), attachment configuration and the mounting parts on a bare conductor 31. The Tag 17 is bonded and placed under the conductor in a small niche made in the Metallic Tag Attachment Clip 32, which is pressed with a suitable insulated pressing tool (not shown), having different heads corresponding to the clip(s) 32 and standards diameters of the different cables used for the rating currents in use. Special epoxy thermal conducting layer should be applied on the cable or inside the clip 32 before being pressed. The Tag 17 is pre-programmed (e.g., by using a development system provided by the tags suppliers), having his unique RFID Code and its current vs. temperature curve is known for the specific clip's and conductor's material. It could also be better adjusted by laboratory tests for each useful cross section, type and material of conductor.

A UV protected and good temperature insulating heat shrinking plastic, form a bonded jacket 33 with some overlapping out of the clip area, on the conductor. It should provide a good protection with one or two layers around the conductor against environmental and weather extreme conditions like wind blows or rain which could introduce errors in the temperature readings relating to the current. The reference SAW Tag 23 (FIG. 1) should also be mounted with such plastic protection jacket.

According to an embodiment of the invention, each SAW RFID Tag should be placed relatively adjacent (i.e., as close as possible) to the Current Measurement Units 19 (which mounted on the pole), it is clear that it will be a field mounting and mostly under grid working conditions at high voltage levels. It is also possible to exploit maintenance works on the grid lines when the lines are out of service to install the tags on the lines conductors. In transmission power lines it is possible to use cameras temporarily (or permanently, especially where cables elongation measurement is desired), until it is possible to install tags during maintenance works when power lines are disconnected.

Figure 4:
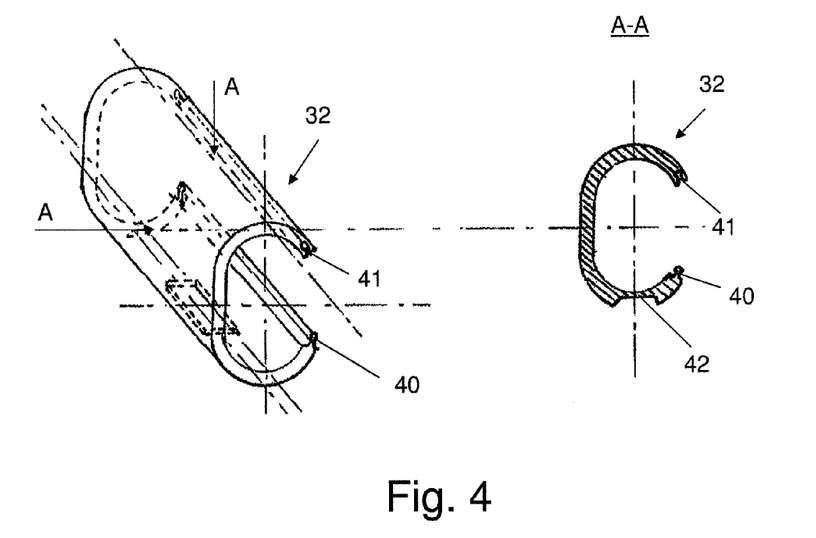
FIG. 4 is a Metallic Tag Attachment Clip before pressing with a special insulated pressing tool in order to connect it to the bare lines conductors.

FIG. 4 shows the Metallic Tag Attachment Clip 32 of SAW RFID Tag 17 before pressing with the suitable insulated tool (as explained hereinabove), according to an embodiment of the present invention. The SAW RFID Tag 17 should be bonded in its special niche 42 under the clip 32, before the pressing. A special tooth 40 made to be inserted in its appropriate slot 41 assures perfect closure. The material from which clip 32 is made of should be the same as conductors' material, in order to prevent corrosion effects and temperature expansion differences, which can harm the good temperature transmission between the conductor and the clip 32.

Referring again to FIG. 5, which shows in a block diagram the Current Measurement Unit (CMU) 19, with its RFID Reader 26 communicating with the SAW RFID Tag 17 attached to the high voltage power lines conductors 15 (same for Tag 18 and conductors 16). The unit can read large number of SAW RFID Tags in a sequence (also simultaneously in interference free systems). In a two lines three phases high voltage, high power transmission line, it is possible to have up to six conductors per phase (equally spaced with strong spacers capable to hold them in case of strong rejecting forces due to fault currents), which mean 36 tags, or 72 tags at a splitting point.

The ADC/DAC 51 and the Controller 52 transform temperature values which are above the ambient temperature of the SAW RFID Tags 17, 18, into RMS currents levels. This is done according to current vs. temperature curve data which was previously fed to the controller 52 (i.e., pre-stored or programmed). The current vs. temperature curve corresponds to physical parameters of the relevant conductor (e.g., the diameter and material of the relevant conductors).

In some embodiments of the present invention, it is possible to use an industrial PC board instead of controller 52, like PC104 (which is an embedded computer standard controlled by the PC/104 Consortium) to get relatively higher calculation/analysis performance of the CMU 19 as an option to extend system's capability to measure and/or transfer additional parameters and data over the power lines.

The wireless transceiver 53, transmit the data to a Supervisory Control and Data Acquisition (SCADA) System of the whole Monitoring and Management System. The Digital Hall Effect Switch 54 provides outage detection (as described in further details hereinafter). This could be transmitted with priority by a burst signal to an Outage Control Monitors 100 at the Control Center 99 (FIG. 9), to enable fast intervention. Alarm burst signals are also provided in case of temperature approach to upper rated limits of specific power lines, giving to the operators of control center 99 the relevant recommendations how to deal with the hazardous temperature increase (high speed increase due to a fault current, peak demand or overloading).

Figure 6:
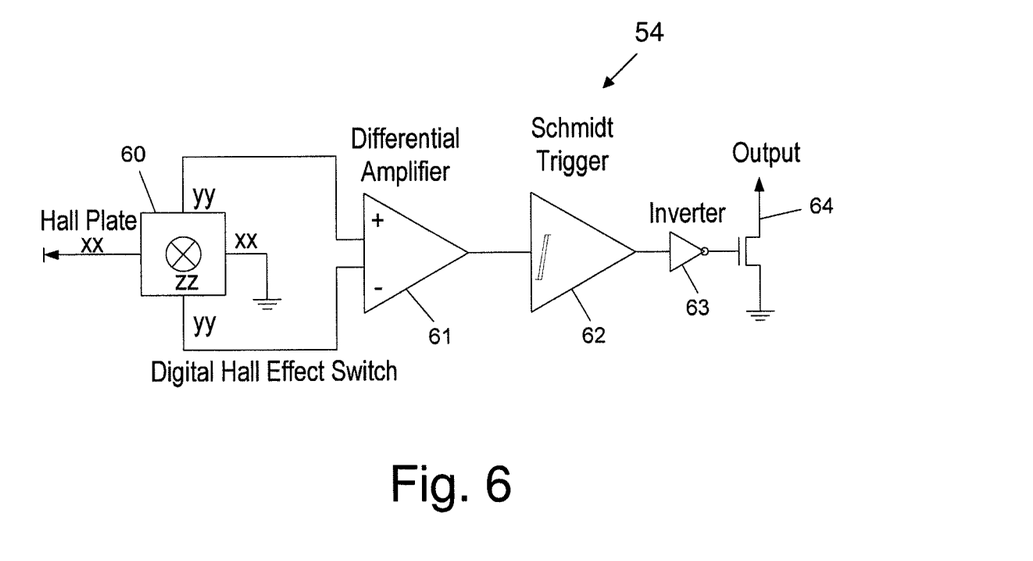
FIG. 6 is a schema of a Digital Hall Effect Switch, used as fast outage detection sensor.

FIG. 6 schematically illustrates the Digital Hall Effect Switch 54, which operates as follows: in normal operation mode the output FET transistor 64 is in cutoff state. In case of an outage, no magnetic field influence the Hall Plate 60 to provide an output voltage to the Differential Amplifier 61 and the output is at zero. With the inverter 63 we get conduction of the FET output 64 and alarm signal is provided to the controller 52 (FIG. 5). The alarm signal is transmitted as a burst transmission with priority to the Control Center 99.

The Hall-Effect principle is named for the physicist Edwin Hall. In 1879 he discovered that when a conducting or semi-conducting rectangular plate with current flowing from one side to the opposite side was introduced perpendicular to a magnetic field, a voltage could be measured at right angle to the current path and to the magnetic field. In other words, in x, y, z (3D) axis system, if the plate is placed with one side parallel to the x axis and the other to the y axis, then the said current, voltage and magnetic field, are parallel to x, y, z axes respectively.

Figure 7:
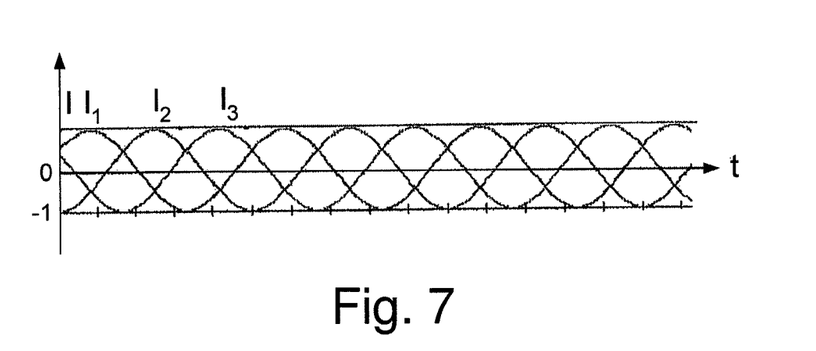
FIG. 7 is a 3 phase current's figures curves used to explain the Hall Effect Switch operation as a line outage detector.

The Hall Effect Switch 54 in the environment of high power poles (or towers) is working in high magnetic fields. The electronic switch is in saturation condition and the level of such magnetic field depends on the distance from the lines conductors and the degree of non symmetry. This because usually the high voltage bare cables of a three phase line are distant from each other and above the Current Measurement Unit 19. There is always significant difference in distance to the CMU 19 between the cables, thus the closer one influence the Hall Effect Switch 54 much more than the others. As the sum of the 3 currents of a line is zero, at big distance from the line (e.g. 30 meter), where the non symmetry does not influence much, the magnetic field is almost zero. For better understanding, the graph of FIG. 7 provides an additional explanation. In low and medium voltage parts of the grid where we can meet many bundled cables in use (twisted inside the insulated jacket), the magnetic field outside the cable is much lower but high enough for the Hall Effect Switch 54 because of the non symmetry of the loads, the shift in phase and currents levels, there is always a residual magnetic field.

FIG. 7 is a graph which shows the currents of a 3-phase ideal line with equal loads and full symmetry. It is easy to see that at each point on the time axis the sum of the three currents is zero. The three currents $I_1$, $I_2$, and $I_3$ are equal in amplitude and 120° shifted from each other. It is easy to see that at zero crossing points the other two curves has the values of $\sin(\pm\pi/3+n\pi)=\pm 0.866$, and at the peak points ($\pm 1$), the other two curves has the values of $\sin((-/+)\pi/6\pm n\pi)=(-/+)0.5$ So, as shown in this graph, in ideal conditions and far enough from the phases conductors (to consider the distance between the conductors as equal to zero), the magnetic field will also be zero. But in our case where the CMU 19 with the Digital Hall Effect Switch 54 is mounted on the conductors' towers, the circuit is working only as on/off switch indicating line outage (3-phase), with no possibility to provide fast detection of one phase disconnection (in 3-phase line or more). This could be detected by following the temperature drop of the conductor, and it takes some time to the SAW RFID Tag unit (about few minutes).

Figure 8:
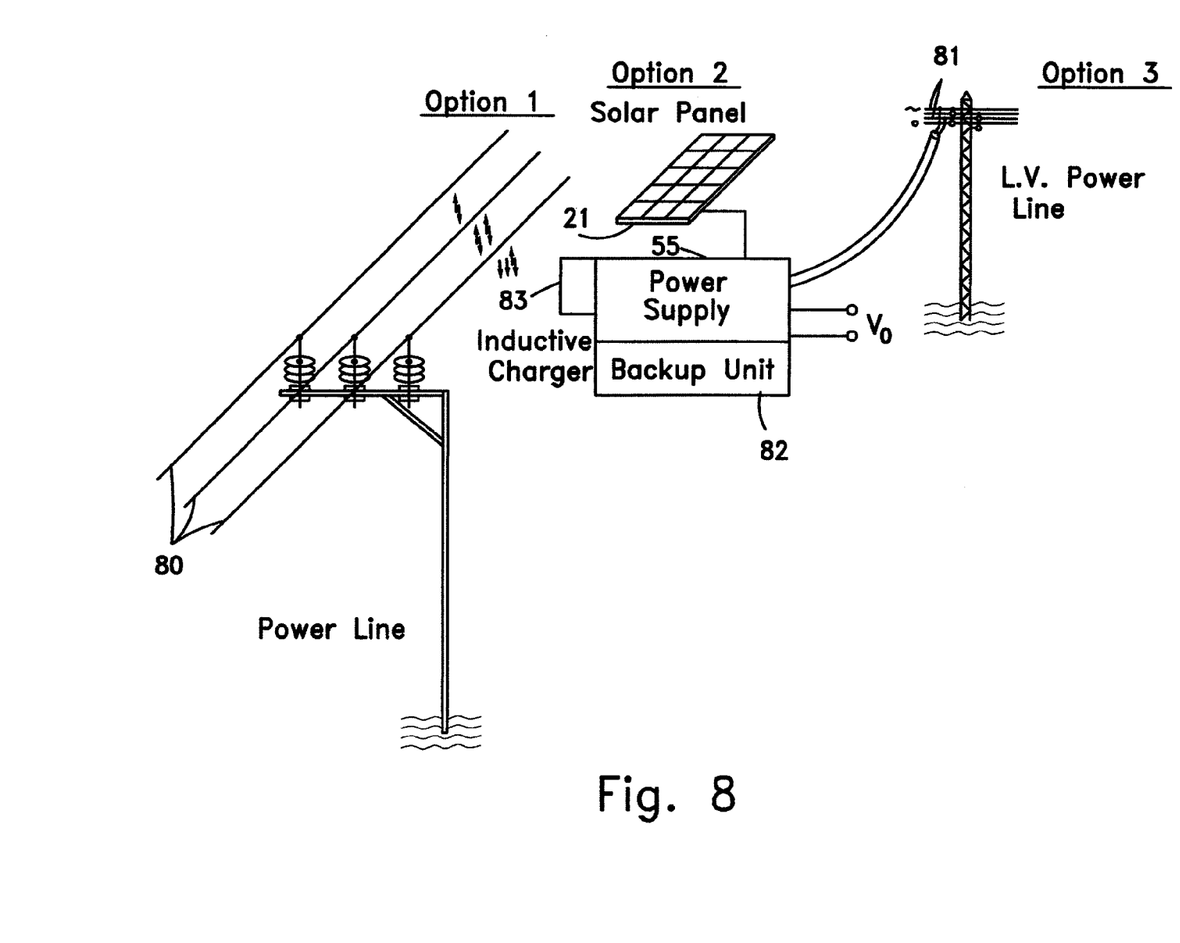
FIG. 8 shows the options to supply power to the Power Supply unit, by Inductive Charger or Solar Panel or by direct connection in low voltage power lines.

FIG. 8 shows 3 options to get energy source for the CMU 19. The power supply unit 55 presented at FIG. 5, could get energy either by an Inductive Charger 83 from the Power Lines 80, or from a Solar PV Panel 21, or in urban areas directly from the Low Voltage Power Lines 81. The Back-up Unit 82 should be of at least 72 hours (lithium type or more advanced type), to enable for solar power source, to over come winter's cloudy days.

FIG. 9 is a bloc diagram describing the whole monitoring and management system enabling to scan in cycling of a minute or less and analyze the currents from up to millions of sensors of an electricity supply network and than display on the Outage and Loading Control Monitors of the Control Center, 100, 101, 99 respectively, the information about the outages and significant deviations from normal power consumption, enabling the operators to do what they should to regulate voltage, connect and disconnect generators, transformers, circuit breakers etc. On the upper side of the bloc diagram, a plurality of Current Measurement Units 93 with their following ordinary numbers (from uvwxyz3 up to uvwxy20) is shown. Each CMU should read with its Tags RFID Reader Antenna 91, n tags 90 corresponding to n phases' conductors of the specific lines splitting point and transmit it via the transmission communication channel choose by the network management according to standards. For example, the communication channel is used in a Data collection Scanning Transceiver 97, with its antenna 96, which describes symbolically the reception unit of all the remote sensors for the SCADA (Supervisory Control and Data Acquisition) system 98, collecting the data and analyzing it in its CPU.

To increase currents scanning speed, it is necessary to split the data accumulation by using the CMU's controllers/PC boards to collect the data from downstream CMU's and forward it in batch upstream up to the substations and then in batches to the computerized system of the Control Center 99. There, by using the accumulated data base and Statistic Process Control (SPC) to detect significant variations in power consumption it enables the operators' intervention in large or local scale, in real time, as the control should work. The computerized unit (e.g., SCADA 98) may include Human Machine Interface (HMI), which enable to present the relevant needed information usefully for the operators on their monitors. By introducing an Interface Generator 102 it is possible to connect to the system all other useful programs and systems 103 already working successfully in the control and monitoring of the network. The software developed which includes the SCADA, SPC, HMI, Interface Generator, Displays Generator, forms a full Manufacturing Execution System (MES), as it is often used in industrial manufacturing (in this case we are in the electricity manufacturing business).

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A system for managing loads and detecting outages over electric power lines, comprising:
   a) a plurality of wireless passive temperature sensors each of which is being attachable to bare conductors of said electric power lines, at line junctions or lines' splitting points, for sensing temperatures generated by the currents flow in said conductors;
   b) Current Measurement Units (CMUs) including Hall Effect Sensors/Switches or Magnetic Field Detection Sensors/Switches and being mounted on poles or towers carrying said electric power lines, for:
      b.1) managing loads by wirelessly reading the temperature sensed by said temperature sensors and performing RMS current measurements in said electric power lines at any voltage levels, by using conversion tables for converting the temperature difference between the line conductors and reference conductors into current level, flowing through said electric power lines;
      b.2) detecting outages by determining, adjacent line junctions or splitting points where said outages occur according to magnetic field absence detection, made by said Hall Effect Sensors/Switches, or by said Magnetic Field Detection Sensors/Switches; and
   c) one or more reference temperature sensors attached to one or more reference conducting cables of the same type as said electric power lines and exposed to the same environmental conditions as the power lines, installed in parallel to the said measured power lines but not carrying current, for providing an ambient temperature indication to a respective one of the CMU's, which is measured on said reference conducting cable at a measured splitting point.

2. A system according to claim 1, in which each CMU comprises the following modules:
   a reader module and its corresponding antenna for endlessly scanning the temperature sensors and reading the temperatures generated by the line cables' currents and the reference sensors' temperatures;
   a plurality of each of an analog-digital and digital-analog converter;
   a controller module for converting the temperature readings into currents according to conversion tables previously adjusted experimentally and in laboratory, each table for a specific reference temperature for the type, cross section and material of the line conductors and the reference conductors and stored in the memory of the controller module incrementally, according to the reference temperatures; and
   a power supply module.

3. A system according to claim 2, in which the reader is selected from the group consisting of: temperature readers, RFID readers, SAW RFID readers or a combination thereof.

4. A system according to claim 2, in which the CMU installed at each measured splitting point further comprises each one, a wireless transceiver and its corresponding antenna for transferring data directly, or from a measured splitting point, to the next measured splitting point, regarding the temperature readings, their associated currents and burst alarm signals, to a remote control center.

5. A system according to claim 2, in which the CMU installed at each measured splitting point further comprises a Hall Effect sensor or a Hall Effect switch or a Magnetic Field Detection Sensor/Switch, for enabling detection and localization of lines' outages whenever no magnetic field influences the sensor/switch to provide an output voltage.

6. A system according to claim 5, in which the CMUs' geographic coordinates are stored in computers of a remote control center or in the controller module of said CMUs for providing reparation teams with relevant GPS data enabling localization of lines' outages and access instructions to a downstream electric tower where currents are still flowing in a splitting line, and the next downstream electric tower which is out of power.

7. A system according to claim 5, in which the CMU has a unique ID number associated to n−1 line conductors and one or more reference temperature conductors, referring to the number of the pole/tower on which said CMU is mounted, having its geographic coordinates stored in a remote Control Center's computers enabling to identify the CMU's transmitted temperatures and currents data, provided by the CMU, and to provide to working/reparation teams a GPS access instruction to the downstream electric tower equipped with a CMU where currents are still flowing in one or more of splitting lines, and a next downstream electric tower equipped with a CMU, which is out of power and to provide fast localization and then reparation to working teams.

8. A system according to claim 2, in which the CMU having a decoding reader and a Hall Effect Sensor/Switch to transmit the currents' reading results and outage burst messages via the controller module and a transceiver module, respectively.

9. A system according to claim 1, further comprising a Data Collection Scanning transceiver or a plurality of Data Collection Scanning transceivers connected to a Supervisory Control and Data Acquisition (SCADA), Statistical Process Control (SPC), Human Machine Interface (HMI) programs completing a full Manufacturing Execution System (MES) on a high speed quad-core CPU to provide for operators at Loading Control Monitors, real time loads management information and outages detection indications at the Outages Control Monitors, and localization.

10. A system according to claim 9, in which the Data Collection Scanning transceivers are selectively located in substations to collect data from their corresponding CMUs accumulated by cascade methods to save scanning time and to send the data in batch, current upstream, to said substations and then in batches to a central or main Data Collection Scanning transceiver.

11. A system according to claim 9, further comprising an Interface Generator for being compatible with Other Customers' Programs and Systems.

12. A system according to claim 1, in which at least one of the plurality of wireless temperature sensors is a passive Temperature SAW RFID Tag, a SAW resonator, or other type of wireless temperature sensor.

13. A system according to claim 1, in which the temperature sensor is attachable to the bare conductor of the electronic power lines by being bonded in a niche under a clip made of the same material as the line conductor, with a tooth and slot to assure thermal contact of the clip by the slot's elastic force and heat transmission by using one of a heat conducting epoxy or other heat sink compound; and wherein the pressed and bonded clip has a slot for the antenna of the temperature sensor, and/or covered by a UV protected and temperature insulating heat shrinking plastic, forming a bonded jacket with overlapping on the bare conductor out of the clip area and one or more layers around the bare conductor, to assure protection against rain or wind that introduce errors in temperature readings.

14. A system according to claim 1, further comprising one or more Integrated Thermal Cameras connected to the CMU for providing the cables' temperatures temporarily or finally, while enabling cables' elongation indications, alarms, and/or later installation of temperature tags when maintenance or reparation work takes place and power lines are out of service.

15. A system according to claim 2, in which the Power Supply is powered by an Inductive Charger, a PV Solar Panel, connected directly to Low Voltage Power Line or any combination thereof and includes a backup rechargeable battery.

16. A method for managing loads and detecting outages over electric power lines, comprising the steps of:
   a) providing a plurality of wireless passive temperature sensors, attaching each of said sensors to bare conductors of said electric power lines, at line junctions or lines' splitting points;
   b) sensing temperature according to the current flow in said bare conductors;
   c) mounting a Current Measurement Unit (CMU) including a Hall Effect Sensor/Switch or a Magnetic Field Detection Sensor/Switch on poles or towers carrying said electric power lines, for:
      c.1) managing loads by wirelessly reading the temperature sensed by said sensors and performing RMS current measurements in said electric power lines at any voltage levels, by using conversion tables for converting the difference between lines' and references' temperatures into current values flowing through said electric power lines;
      c.2) detecting outages by determining, adjacent line junctions or splitting points where said outages occur according to magnetic field absence detection, made by said Hall Effect Sensors/Switches, or by said Magnetic Field Detection Sensors/Switches;
   d) attaching one or more reference temperature sensors to one or more reference conducting cables of the same type as said electric power lines and exposed to the same environmental conditions as the power lines, installed in parallel to the said measured power lines but not carrying current; and
   e) providing an ambient temperature indication to said CMU, which is measured on said reference conducting cables at a measured splitting point.

\* \* \* \* \*